(12) United States Patent
Miess et al.

(10) Patent No.: US 11,746,875 B2
(45) Date of Patent: Sep. 5, 2023

(54) CAM FOLLOWER WITH POLYCRYSTALLINE DIAMOND ENGAGEMENT ELEMENT

(71) Applicant: XR Reserve LLC, Houston, TX (US)

(72) Inventors: David P. Miess, Magnolia, TX (US); Gregory Prevost, Spring, TX (US); Michael V. Williams, Conroe, TX (US)

(73) Assignee: XR Reserve LLC, Houston, TX (US)

( * ) Notice: Subject to any disclaimer, the term of this patent is extended or adjusted under 35 U.S.C. 154(b) by 0 days.

(21) Appl. No.: 17/959,738

(22) Filed: Oct. 4, 2022

(65) Prior Publication Data

US 2023/0086847 A1 Mar. 23, 2023

Related U.S. Application Data

(63) Continuation of application No. 17/191,808, filed on Mar. 4, 2021, now Pat. No. 11,499,619, which is a
(Continued)

(51) Int. Cl.
| | |
|---|---|
| *F16H 53/06* | (2006.01) |
| *F01L 1/04* | (2006.01) |
| *C23C 16/22* | (2006.01) |
| *B23P 5/00* | (2006.01) |
| *C23C 16/27* | (2006.01) |

(Continued)

(52) U.S. Cl.
CPC .............. *F16H 53/06* (2013.01); *B23P 5/00* (2013.01); *C23C 16/27* (2013.01); *F01L 1/04* (2013.01); *F01L 5/24* (2013.01); *F16H 25/14* (2013.01); *F16H 57/041* (2013.01)

(58) Field of Classification Search
CPC ........ F16H 25/12; F16H 25/14; F16H 53/025; F16H 53/06; F16H 53/08; F01L 1/04; F01L 1/16; F01L 5/24; F01L 2301/00; B23P 5/00; C23C 16/27
See application file for complete search history.

(56) References Cited

U.S. PATENT DOCUMENTS

| 1,798,604 A | 3/1931 | Hoke |
| 1,963,956 A | 6/1934 | James |
(Continued)

FOREIGN PATENT DOCUMENTS

| CA | 2891268 A1 | 11/2016 |
| DE | 4226986 A1 | 2/1994 |
(Continued)

OTHER PUBLICATIONS

Bovenkerk, Dr. H. P.; Bundy, Dr. F. P.; Hall, Dr. H. T.; Strong, Dr. H. M.; Wentorf, Jun., Dr. R. H.; Preparation of Diamond, Nature, Oct. 10, 1959, pp. 1094-1098, vol. 184.
(Continued)

*Primary Examiner* — Adam D Rogers
(74) *Attorney, Agent, or Firm* — Michael S. McCoy; Amatong McCoy LLC

(57) ABSTRACT

A cam follower is provided. The cam follower includes a polycrystalline diamond element, including an engagement surface. The engagement surface of the polycrystalline diamond element is positioned on the cam follower for sliding engagement with an opposing engagement surface of a cam. The cam includes at least some of a diamond reactive material.

22 Claims, 4 Drawing Sheets

Related U.S. Application Data continuation of application No. 16/589,303, filed on Oct. 1, 2019, now Pat. No. 10,968,991, which is a continuation of application No. 16/049,588, filed on Jul. 30, 2018, now Pat. No. 10,465,775.

(51) Int. Cl.
  *F16H 57/04* (2010.01)
  *F01L 5/24* (2006.01)
  *F16H 25/14* (2006.01)

(56) References Cited

U.S. PATENT DOCUMENTS

| | | |
|---|---|---|
| 2,259,023 A | 10/1941 | Clark |
| 2,299,978 A | 10/1942 | Hall |
| 2,407,586 A | 9/1946 | Summers |
| 2,567,735 A | 9/1951 | Scott |
| 2,693,396 A | 11/1954 | Gondek |
| 2,758,181 A | 8/1956 | Crouch |
| 2,788,677 A | 4/1957 | Hayek |
| 2,877,662 A | 3/1959 | Eduard |
| 2,897,016 A | 7/1959 | Baker |
| 2,947,609 A | 8/1960 | Strong |
| 2,947,610 A | 8/1960 | Hall et al. |
| 3,132,904 A | 5/1964 | Kohei et al. |
| 3,559,802 A | 2/1971 | Eidus |
| 3,582,161 A | 6/1971 | Hudson |
| 3,603,652 A | 9/1971 | Youden |
| 3,650,714 A | 3/1972 | Farkas |
| 3,697,141 A | 10/1972 | Garrett |
| 3,707,107 A | 12/1972 | Bieri |
| 3,741,252 A | 6/1973 | Williams |
| 3,745,623 A | 7/1973 | Wentorf et al. |
| 3,752,541 A | 8/1973 | Mcvey |
| 3,866,987 A | 2/1975 | Gamer |
| 3,869,947 A | 3/1975 | Vandenkieboom |
| 3,920,290 A | 11/1975 | Evarts |
| 4,085,634 A | 4/1978 | Sattler |
| 4,182,537 A | 1/1980 | Oster |
| 4,225,322 A | 9/1980 | Knemeyer |
| 4,238,137 A | 12/1980 | Furchak et al. |
| 4,285,550 A | 8/1981 | Blackburn et al. |
| 4,364,136 A | 12/1982 | Hattan |
| 4,382,637 A | 5/1983 | Blackburn et al. |
| 4,398,772 A | 8/1983 | Odell |
| 4,410,054 A | 10/1983 | Nagel et al. |
| 4,410,284 A | 10/1983 | Herrick |
| 4,428,627 A | 1/1984 | Teramachi |
| 4,432,682 A | 2/1984 | McKewan |
| 4,468,138 A | 8/1984 | Nagel |
| 4,525,178 A | 6/1985 | Hall |
| 4,554,208 A | 11/1985 | MacIver et al. |
| 4,560,014 A | 12/1985 | Geczy |
| 4,620,601 A | 11/1986 | Nagel |
| RE32,380 E | 3/1987 | Wentorf, Jr. et al. |
| 4,662,348 A | 5/1987 | Hall et al. |
| 4,679,639 A | 7/1987 | Barr et al. |
| 4,689,847 A | 9/1987 | Huber |
| 4,720,199 A | 1/1988 | Geczy et al. |
| 4,729,440 A | 3/1988 | Hall |
| 4,732,490 A | 3/1988 | Masciarelli |
| 4,738,322 A | 4/1988 | Hall et al. |
| 4,764,036 A | 8/1988 | McPherson |
| 4,796,670 A | 1/1989 | Russell et al. |
| 4,797,011 A | 1/1989 | Saeki et al. |
| 4,858,688 A | 8/1989 | Edwards et al. |
| 4,906,528 A | 3/1990 | Cerceau et al. |
| 4,958,692 A | 9/1990 | Anderson |
| 5,011,514 A | 4/1991 | Cho et al. |
| 5,011,515 A | 4/1991 | Frushour |
| 5,030,276 A | 7/1991 | Sung et al. |
| 5,037,212 A | 8/1991 | Justman et al. |
| 5,066,145 A | 11/1991 | Sibley et al. |
| 5,067,826 A | 11/1991 | Lemelson |
| 5,092,687 A | 3/1992 | Hall |
| 5,112,146 A | 5/1992 | Stangeland |
| 5,123,772 A | 6/1992 | Anderson |
| 5,151,107 A | 9/1992 | Cho et al. |
| 5,176,483 A | 1/1993 | Baumann et al. |
| 5,193,363 A | 3/1993 | Petty |
| 5,205,188 A | 4/1993 | Repenning et al. |
| 5,253,939 A | 10/1993 | Hall |
| 5,271,749 A | 12/1993 | Rai et al. |
| 5,351,770 A | 10/1994 | Cawthorne et al. |
| 5,358,041 A | 10/1994 | O'Hair |
| 5,358,337 A | 10/1994 | Codatto |
| 5,375,679 A | 12/1994 | Biehl |
| 5,385,715 A | 1/1995 | Fish |
| 5,447,208 A | 9/1995 | Lund et al. |
| 5,462,362 A | 10/1995 | Yuhta et al. |
| 5,464,086 A | 11/1995 | Coelln |
| 5,514,183 A | 5/1996 | Epstein et al. |
| 5,522,467 A | 6/1996 | Stevens et al. |
| 5,533,604 A | 7/1996 | Brierton |
| 5,538,346 A | 7/1996 | Frias et al. |
| 5,540,314 A | 7/1996 | Coelln |
| 5,560,716 A | 10/1996 | Tank et al. |
| 5,618,114 A | 4/1997 | Katahira |
| 5,645,617 A | 7/1997 | Frushour |
| 5,653,300 A | 8/1997 | Lund et al. |
| 5,715,898 A | 2/1998 | Anderson |
| 5,833,019 A | 11/1998 | Gynz-Rekowski |
| 5,855,996 A | 1/1999 | Corrigan et al. |
| 5,948,541 A | 9/1999 | Inspektor |
| 6,045,029 A | 4/2000 | Scott |
| 6,109,790 A | 8/2000 | Gynz-Rekowski et al. |
| 6,120,185 A | 9/2000 | Masciarelli |
| 6,129,195 A | 10/2000 | Matheny |
| 6,152,223 A | 11/2000 | Abdo et al. |
| 6,164,109 A | 12/2000 | Bartosch |
| 6,209,185 B1 | 4/2001 | Scott |
| 6,279,716 B1 | 8/2001 | Kayatani et al. |
| 6,378,633 B1 | 4/2002 | Moore et al. |
| 6,409,388 B1 | 6/2002 | Lin |
| 6,457,865 B1 | 10/2002 | Masciarelli, Jr. |
| 6,488,103 B1 | 12/2002 | Dennis et al. |
| 6,488,715 B1 | 12/2002 | Pope et al. |
| 6,516,934 B2 | 2/2003 | Masciarelli, Jr. |
| 6,517,583 B1 | 2/2003 | Pope et al. |
| 6,652,201 B2 | 11/2003 | Kunimori et al. |
| 6,655,845 B1 | 12/2003 | Pope et al. |
| 6,737,377 B1 | 5/2004 | Sumiya et al. |
| 6,764,219 B2 | 7/2004 | Doll et al. |
| 6,808,019 B1 | 10/2004 | Mabry |
| 6,814,775 B2 | 11/2004 | Scurlock et al. |
| 6,951,578 B1 | 10/2005 | Belnap et al. |
| 7,007,787 B2 | 3/2006 | Pallini et al. |
| 7,128,173 B2 | 10/2006 | Lin |
| 7,198,043 B1 | 4/2007 | Zhang |
| 7,234,541 B2 | 6/2007 | Scott et al. |
| 7,311,159 B2 | 12/2007 | Lin et al. |
| 7,441,610 B2 | 10/2008 | Belnap et al. |
| 7,475,744 B2 | 1/2009 | Pope |
| 7,552,782 B1 | 6/2009 | Sexton et al. |
| 7,703,982 B2 | 4/2010 | Cooley |
| 7,737,377 B1 | 6/2010 | Dodal et al. |
| 7,845,436 B2 | 12/2010 | Cooley et al. |
| 7,861,805 B2 | 1/2011 | Dick et al. |
| 7,870,913 B1 | 1/2011 | Sexton et al. |
| 8,069,933 B2 | 12/2011 | Sexton et al. |
| 8,080,071 B1 | 12/2011 | Vail |
| 8,109,247 B2 | 2/2012 | Wakade et al. |
| 8,119,240 B2 | 2/2012 | Cooper |
| 8,163,232 B2 | 4/2012 | Fang et al. |
| 8,277,124 B2 | 10/2012 | Sexton et al. |
| 8,277,722 B2 | 10/2012 | DiGiovanni |
| 8,365,846 B2 | 2/2013 | Dourfaye et al. |
| 8,480,304 B1 | 7/2013 | Cooley et al. |
| 8,485,284 B2 | 7/2013 | Sithebe |
| 8,613,554 B2 | 12/2013 | Tessier et al. |
| 8,627,904 B2 | 1/2014 | Voronin |
| 8,678,657 B1 | 3/2014 | Knuteson et al. |
| 8,701,797 B2 | 4/2014 | Baudoin |
| 8,702,824 B1 | 4/2014 | Sani et al. |

(56) References Cited

U.S. PATENT DOCUMENTS

| | | |
|---|---|---|
| 8,734,550 B1 | 5/2014 | Sani |
| 8,757,299 B2 | 6/2014 | DiGiovanni et al. |
| 8,763,727 B1 | 7/2014 | Cooley et al. |
| 8,764,295 B2 | 7/2014 | Dadson et al. |
| 8,881,849 B2 | 11/2014 | Shen et al. |
| 8,911,521 B1 | 12/2014 | Miess et al. |
| 8,939,652 B2 | 1/2015 | Peterson et al. |
| 8,974,559 B2 | 3/2015 | Frushour |
| 9,004,198 B2 | 4/2015 | Kulkarni |
| 9,010,418 B2 | 4/2015 | Pereyra et al. |
| 9,045,941 B2 | 6/2015 | Chustz |
| 9,103,172 B1 | 8/2015 | Bertagnolli et al. |
| 9,127,713 B1 | 9/2015 | Lu |
| 9,145,743 B2 | 9/2015 | Shen et al. |
| 9,222,515 B2 | 12/2015 | Chang |
| 9,273,381 B2 | 3/2016 | Qian et al. |
| 9,284,980 B1 | 3/2016 | Miess |
| 9,309,923 B1 | 4/2016 | Lingwall et al. |
| 9,353,788 B1 | 5/2016 | Tulett et al. |
| 9,366,085 B2 | 6/2016 | Panahi |
| 9,404,310 B1 | 8/2016 | Sani et al. |
| 9,410,573 B1 | 8/2016 | Lu |
| 9,429,188 B2 | 8/2016 | Peterson et al. |
| 9,488,221 B2 | 11/2016 | Gonzalez |
| 9,562,562 B2 | 2/2017 | Peterson |
| 9,611,885 B1 | 4/2017 | Cooley et al. |
| 9,643,293 B1 | 5/2017 | Miess et al. |
| 9,702,401 B2 | 7/2017 | Gonzalez |
| 9,732,791 B1 | 8/2017 | Gonzalez |
| 9,776,917 B2 | 10/2017 | Tessitore et al. |
| 9,790,749 B2 | 10/2017 | Chen |
| 9,790,818 B2 | 10/2017 | Berruet et al. |
| 9,803,432 B2 | 10/2017 | Wood et al. |
| 9,822,523 B1 | 11/2017 | Miess |
| 9,840,875 B2 | 12/2017 | Harvey et al. |
| 9,869,135 B1 | 1/2018 | Martin |
| 10,060,192 B1 | 8/2018 | Miess et al. |
| 10,113,362 B2 | 10/2018 | Ritchie et al. |
| 10,279,454 B2 | 5/2019 | DiGiovanni et al. |
| 10,294,986 B2 | 5/2019 | Gonzalez |
| 10,307,891 B2 | 6/2019 | Daniels et al. |
| 10,408,086 B1 | 9/2019 | Meier |
| 10,465,775 B1 | 11/2019 | Miess et al. |
| 10,683,895 B2 | 6/2020 | Hall et al. |
| 10,711,792 B2 | 7/2020 | Vidalenc et al. |
| 10,711,833 B2 | 7/2020 | Manwill et al. |
| 10,738,821 B2 | 8/2020 | Miess et al. |
| 10,807,913 B1 | 10/2020 | Hawks et al. |
| 10,968,700 B1 | 4/2021 | Raymond |
| 10,968,703 B2 | 4/2021 | Haugvaldstad et al. |
| 11,014,759 B2 | 5/2021 | Miess et al. |
| 11,035,407 B2 | 6/2021 | Prevost et al. |
| 11,054,000 B2 | 7/2021 | Prevost et al. |
| 11,085,488 B2 | 8/2021 | Gonzalez |
| 11,187,040 B2 | 11/2021 | Prevost et al. |
| 11,225,842 B2 | 1/2022 | Reese et al. |
| 11,242,891 B2 * | 2/2022 | Miess .................. F16C 17/02 |
| 11,274,731 B2 * | 3/2022 | Prevost .................. F16D 3/26 |
| 11,499,619 B2 * | 11/2022 | Miess .................. F01L 1/14 |
| 2002/0020526 A1 | 2/2002 | Male et al. |
| 2003/0019106 A1 | 1/2003 | Pope et al. |
| 2003/0075363 A1 | 4/2003 | Lin et al. |
| 2003/0159834 A1 | 8/2003 | Kirk et al. |
| 2003/0220691 A1 | 11/2003 | Songer et al. |
| 2004/0031625 A1 | 2/2004 | Lin et al. |
| 2004/0134687 A1 | 7/2004 | Radford et al. |
| 2004/0163822 A1 | 8/2004 | Zhang et al. |
| 2004/0219362 A1 | 11/2004 | Wort et al. |
| 2004/0223676 A1 | 11/2004 | Pope et al. |
| 2006/0060392 A1 | 3/2006 | Eyre |
| 2006/0165973 A1 | 7/2006 | Dumm et al. |
| 2007/0046119 A1 | 3/2007 | Cooley |
| 2008/0217063 A1 | 9/2008 | Moore et al. |
| 2008/0253706 A1 | 10/2008 | Bischof et al. |
| 2009/0020046 A1 | 1/2009 | Marcelli |
| 2009/0087563 A1 | 4/2009 | Voegele et al. |
| 2009/0268995 A1 | 10/2009 | Ide et al. |
| 2010/0037864 A1 | 2/2010 | Dutt et al. |
| 2010/0276200 A1 | 11/2010 | Schwefe et al. |
| 2010/0307069 A1 | 12/2010 | Bertagnolli et al. |
| 2011/0174547 A1 | 7/2011 | Sexton et al. |
| 2011/0203791 A1 | 8/2011 | Jin et al. |
| 2011/0220415 A1 | 9/2011 | Jin et al. |
| 2011/0297454 A1 | 12/2011 | Shen et al. |
| 2012/0037425 A1 | 2/2012 | Sexton et al. |
| 2012/0057814 A1 | 3/2012 | Dadson et al. |
| 2012/0225253 A1 | 9/2012 | DiGiovanni et al. |
| 2012/0281938 A1 | 11/2012 | Peterson et al. |
| 2013/0000442 A1 | 1/2013 | Wiesner et al. |
| 2013/0004106 A1 | 1/2013 | Wenzel |
| 2013/0092454 A1 | 4/2013 | Scott et al. |
| 2013/0146367 A1 | 6/2013 | Zhang et al. |
| 2013/0170778 A1 | 7/2013 | Higginbotham et al. |
| 2014/0037232 A1 | 2/2014 | Marchand et al. |
| 2014/0176139 A1 | 6/2014 | Espinosa et al. |
| 2014/0254967 A1 | 9/2014 | Gonzalez |
| 2014/0341487 A1 | 11/2014 | Cooley et al. |
| 2014/0355914 A1 | 12/2014 | Cooley et al. |
| 2015/0027713 A1 | 1/2015 | Penisson |
| 2015/0132539 A1 | 5/2015 | Bailey et al. |
| 2016/0153243 A1 | 6/2016 | Hinz et al. |
| 2016/0312535 A1 | 10/2016 | Ritchie et al. |
| 2017/0030393 A1 | 2/2017 | Phua et al. |
| 2017/0138224 A1 | 5/2017 | Henry et al. |
| 2017/0234071 A1 | 8/2017 | Spatz et al. |
| 2017/0261031 A1 | 9/2017 | Gonzalez et al. |
| 2018/0087134 A1 | 3/2018 | Chang et al. |
| 2018/0209476 A1 | 7/2018 | Gonzalez |
| 2018/0216661 A1 | 8/2018 | Gonzalez |
| 2018/0264614 A1 | 9/2018 | Winkelmann et al. |
| 2018/0320740 A1 | 11/2018 | Hall et al. |
| 2019/0063495 A1 | 2/2019 | Peterson et al. |
| 2019/0136628 A1 | 5/2019 | Savage et al. |
| 2019/0170186 A1 | 6/2019 | Gonzalez et al. |
| 2020/0032841 A1 | 1/2020 | Miess et al. |
| 2020/0032846 A1 | 1/2020 | Miess et al. |
| 2020/0056659 A1 | 2/2020 | Prevost et al. |
| 2020/0182290 A1 | 6/2020 | Doehring et al. |
| 2020/0362956 A1 | 11/2020 | Prevost et al. |
| 2021/0140277 A1 | 5/2021 | Hall et al. |
| 2021/0148406 A1 | 5/2021 | Hoyle et al. |
| 2021/0198949 A1 | 7/2021 | Haugvaldstad et al. |
| 2021/0207437 A1 | 7/2021 | Raymond |
| 2021/0222734 A1 | 7/2021 | Gonzalez et al. |
| 2022/0170322 A1 * | 6/2022 | Prevost .................. E21B 4/003 |
| 2022/0178214 A1 * | 6/2022 | Reese .................. E21B 17/1085 |
| 2022/0213925 A1 * | 7/2022 | Miess .................. F16C 33/043 |

FOREIGN PATENT DOCUMENTS

| | | |
|---|---|---|
| DE | 29705983 U1 | 6/1997 |
| JP | S6061404 A | 4/1985 |
| JP | 06174051 A | 6/1994 |
| JP | 2004002912 A | 1/2004 |
| JP | 2008056735 A | 3/2008 |
| WO | 8700080 A1 | 1/1987 |
| WO | 2004001238 A2 | 12/2003 |
| WO | 2006011028 A1 | 2/2006 |
| WO | 2006028327 A1 | 3/2006 |
| WO | 2013043917 A1 | 3/2013 |
| WO | 2014189763 A1 | 11/2014 |
| WO | 2016089680 A1 | 6/2016 |
| WO | 2017105883 A1 | 6/2017 |
| WO | 2018041578 A1 | 3/2018 |
| WO | 2018226380 A1 | 12/2018 |
| WO | 2019096851 A1 | 5/2019 |

OTHER PUBLICATIONS

Chen, Y.; Nguyen, T; Zhang, L.C.; Polishing of polycrystalline diamond by the technique of dynamic friction—Part 5: Quantitative analysis of material removal, International Journal of Machine Tools & Manufacture, 2009, pp. 515-520, vol. 49, Elsevier.

(56) References Cited

OTHER PUBLICATIONS

Chen, Y.; Zhang, L.C.; Arsecularatne, J.A.; Montross, C.; Polishing of polycrystalline diamond by the technique of dynamic friction, part 1: Prediction of the interface temperature rise, International Journal of Machine Tools & Manufacture, 2006, pp. 580-587, vol. 46, Elsevier.
Chen, Y.; Zhang, L.C.; Arsecularatne, J.A.; Polishing of polycrystalline diamond by the technique of dynamic friction. Part 2: Material removal mechanism, International Journal of Machine Tools & Manufacture, 2007, pp. 1615-1624, vol. 47, Elsevier.
Chen, Y.; Zhang, L.C.; Arsecularatne, J.A.; Zarudi, I., Polishing of polycrystalline diamond by the technique of dynamic friction, part 3: Mechanism exploration through debris analysis, International Journal of Machine Tools & Manufacture, 2007, pp. 2282-2289, vol. 47, Elsevier.
Chen, Y.; Zhang, L.C.; Polishing of polycrystalline diamond by the technique of dynamic friction, part 4: Establishing the polishing map, International Journal of Machine Tools & Manufacture, 2009, pp. 309-314, vol. 49, Elsevier.
Dobrzhinetskaya, Larissa F.; Green, II, Harry W.; Diamond Synthesis from Graphite in the Presence of Water and SiO2: Implications for Diamond Formation in Quartzites from Kazakhstan, International Geology Review, 2007, pp. 389-400, vol. 49.
Element six, The Element Six CVD Diamond Handbook, Accessed on Nov. 1, 2019, 28 pages.
Grossman, David, What the World Needs Now is Superhard Carbon, Popular Mechanics, https://www.popularmechanics.com/science/environment/a28970718/superhard-materials/,Sep. 10, 2019, 7 pages, Hearst Magazine Media, Inc.
Hudson Bearings Air Cargo Ball Transfers brochure, accessed on Jun. 23, 2018, 8 Pages, Columbus, Ohio.
Hudson Bearings Air Cargo Ball Transfers Installation and Maintenance Protocols, accessed on Jun. 23, 2018, pp. 1-5.
International Search Report and Written Opinion dated Aug. 3, 2020 (issued in PCT Application No. PCT/US20/21549) [11 pages].
International Search Report and Written Opinion dated Aug. 4, 2020 (issued in PCT Application No. PCT/US2020/034437) [10 pages].
International Search Report and Written Opinion dated Jan. 15, 2021 (issued in PCT Application No. PCT/US2020/049382) [18 pages].
International Search Report and Written Opinion dated Oct. 21, 2019 (issued in PCT Application No. PCT/US2019/043746) [14 pages].
International Search Report and Written Opinion dated Oct. 22, 2019 (issued in PCT Application No. PCT/US2019/043744) [11 pages].
International Search Report and Written Opinion dated Oct. 25, 2019 (issued in PCT Application No. PCT/US2019/044682) [20 pages].
International Search Report and Written Opinion dated Oct. 29, 2019 (issued in PCT Application No. PCT/US2019/043741) [15 pages].
International Search Report and Written Opinion dated Sep. 2, 2020 (issued in PCT Application No. PCT/US20/37048) [8 pages].
International Search Report and Written Opinion dated Sep. 8, 2020 (issued in PCT Application No. PCT/US20/35316) [9 pages].
International Search Report and Written Opinion dated Sep. 9, 2019 (issued in PCT Application No. PCT/US2019/043732) [10 pages].
International Search Report and Written Opinion dated Sep. 9, 2020 (issued in PCT Application No. PCT/US20/32196) [13 pages].
Liao, Y.; Marks, L.; In situ single asperity wear at the nanometre scale, International Materials Reviews, 2016, pp. 1-17, Taylor & Francis.
Linear Rolling Bearings ME EN 7960—Precision Machine Design Topic 8, Presentation, Accessed on Jan. 26, 2020, 23 Pages, University of Utah.
Linear-motion Bearing, Wikipedia, https://en.wikipedia.org/w/index.php?title=Linear-motion_bearing&oldid=933640111, Jan. 2, 2020, 4 Pages.
Machinery's Handbook 30th Edition, Copyright Page and Coefficients of Friction Page, 2016, p. 158 (2 Pages total) Industrial Press, Inc, South Norwalk, U.S.A.
Machinery's Handbook, 2016, Industrial Press, Inc., 30th edition, pp. 843 and 1055 (6 pages total).
McCarthy, J. Michael; Cam and Follower Systems, PowerPoint Presentation, Jul. 25, 2009, pp. 1-14, UCIrvine The Henry Samueli School of Engineering.
McGill Cam Follower Bearings brochure, 2005, p. 1-19, Back Page, Brochure MCCF-05, Form #8991 (20 Pages total).
Motion & Control NSK Cam Followers (Stud Type Track Rollers) Roller Followers (Yoke Type Track Rollers) catalog, 1991, Cover Page, pp. 1-18, Back Page, CAT. No. E1421 2004 C-11, Japan.
Product Catalogue, Asahi Diamond Industrial Australia Pty. Ltd., accessed on Jun. 23, 2018, Cover Page, Blank Page, 2 Notes Pages, Table of Contents, pp. 1-49 (54 Pages total).
RBC Aerospace Bearings Rolling Element Bearings catalog, 2008, Cover Page, First Page, pp. 1-149, Back Page (152 Pages total).
RGPBalls Ball Transfer Units catalog, accessed on Jun. 23, 2018, pp. 1-26, 2 Back Pages (28 Pages total).
Sandvik Coromant Hard part turning with CBN catalog, 2012, pp. 1-42, 2 Back Pages (44 Pages total).
Sexton, Timothy N.; Cooley, Craig H.; Diamond Bearing Technology for Deep and Geothermal Drilling, PowerPoint Presentation, 2010, 16 Pages.
SKF Ball transfer units catalog, Dec. 2006, Cover Page, Table of Contents, pp. 1-36, 2 Back Pages (40 Pages total), Publication 940-711.
Sowers, Jason Michael, Examination of the Material Removal Rate in Lapping Polycrystalline Diamond Compacts, A Thesis, Aug. 2011, 2 Cover Pages, pp. iii-xiv, pp. 1-87 (101 Pages total).
Sun, Liling; Wu, Qi; Dai, Daoyang; Zhang, Jun; Qin, Zhicheng; Wang, Wenkui; Non-metallic catalysts for diamond synthesis under high pressure and high temperature, Science in China (Series A), Aug. 1999, pp. 834-841, vol. 42 No. 8, China.
Superhard Material, Wikipedia, https://en.wikipedia.org/wiki/Superhard_material, Retrieved from https://en.wikipedia.org/w/index.php?title=Superhard_material&oldid=928571597, Nov. 30, 2019, 14 pages.
Surface Finish, Wikipedia, https://en.wikipedia.org/wiki/Surface_finish, Retrieved from https://en.wikipedia.org/w/index.php?title=Surface_finish&oldid=919232937, Oct. 2, 2019, 3 pages.
United States Defensive Publication No. T102,901, published Apr. 5, 1983, in U.S. Application No. 298,271 [2 Pages].
USSynthetic Bearings and Waukesha Bearings brochure for Diamond Tilting Pad Thrust Bearings, 2015, 2 Pages.
USSynthetic Bearings brochure, accessed on Jun. 23, 2018, 12 Pages, Orem, Utah.
Zeidan, Fouad Y.; Paquette, Donald J., Application of High Speed and High Performance Fluid Film Bearings in Rotating Machinery, 1994, pp. 209-234.
Zhigadlo, N. D., Spontaneous growth of diamond from MnNi solvent-catalyst using opposed anvil-type high-pressure apparatus, accessed on Jun. 28, 2018, pp. 1-12, Laboratory for Solid State Physics, Switzerland.
Zou, Lai; Huang, Yun; Zhou, Ming; Xiao, Guijian; Thermochemical Wear of Single Crystal Diamond Catalyzed by Ferrous Materials at Elevated Temperature, Crystals, 2017, pp. 1-10, vol. 7.

\* cited by examiner

CAM FOLLOWER WITH POLYCRYSTALLINE DIAMOND ENGAGEMENT ELEMENT

CROSS-REFERENCE TO RELATED APPLICATIONS

The present application is a Continuation of U.S. application Ser. No. 17/191,808, filed on Mar. 4, 2021 (allowed), which is a Continuation of U.S. patent application Ser. No. 16/589,303, filed on Oct. 1, 2019 (now U.S. Pat. No. 10,968,991), which is a Continuation of U.S. application Ser. No. 16/049,588, filed on Jul. 30, 2018 (now U.S. Pat. No. 10,465,775), the entirety of which are incorporated herein by reference. The present application is related to U.S. patent application Ser. No. 15/430,254, entitled "Drilling Machine", filed on Feb. 10, 2017 (now U.S. Pat. No. 10,626,674) and assigned to the same assignee as the present application, and which is incorporated herein in by reference its entirety as if set out in full. The present application is also related to: U.S. patent application Ser. No. 16/049,631, entitled "Roller Ball Assembly with Superhard Elements" filed on Jul. 30, 2018 (now U.S. Pat. No. 11,014,759) U.S. patent application Ser. No. 16/049,608, entitled "Polycrystalline Diamond Radial Bearing" (now U.S. Pat. No. 10,738,821); and U.S. patent application Ser. No. 16/049,617, entitled "Polycrystalline Diamond Thrust Bearing and Element Thereof", filed on Jul. 30, 2018 (now U.S. Pat. No. 10,760,615), each of which is assigned to the same assignee as the present application and is incorporated herein by reference in its entirety as if set out in full.

STATEMENT REGARDING FEDERALLY SPONSORED RESEARCH OF DEVELOPMENT

Not applicable.

FIELD

The present disclosure relates to cam followers, apparatus and systems including the same, and methods of use thereof.

BACKGROUND

Cam followers are used to translate the motion imparted from a cam to another component. For instance, the rotating motion of a cylindrical cam can be translated into linear motion by a cam follower. Cam followers are employed in engagement with cams in a vast number of mechanisms including internal combustion engines, valves, pumps, compressors, machine tools, fabric processing equipment, downhole rotary steerable systems, downhole agitators, and drilling machines such as the drilling machine disclosed in incorporated U.S. patent application Ser. No. 15/430,254 (the '254 application), among other mechanisms.

Cam followers are categorized into two primary groups, including roller cam followers and non-roller cam followers. For roller cam followers, yoke mount or stud mount rolling members are employed. These rolling members are of the bushing type, or employ ball, roller, or needle bearings or a combination thereof. Non-roller cam followers are classified as knife edge, flat-face, or curved shoe, which is sometimes called mushroom. Table 1, below, sets forth various cam followers, including associated drawbacks.

TABLE 1

| Roller | Drawbacks (roller) | Fixed | Drawbacks (fixed) |
| --- | --- | --- | --- |
| Bushing | Friction lower than Fixed followers but higher than other roller types | Knife Edge | High contact stress and rapid wear |
| Roller Bearings/ Needle Bearings | Many small moving parts In some applications require seals and lubrication | Flat Face | Higher friction forces due to sliding contact |
| Ball or Ball and Roller Bearings | Many small moving parts In some applications require seals and lubrication | Curved Shoe or Mushroom | Higher friction forces due to sliding contact |

Thermally stable polycrystalline diamond (TSP), either supported or unsupported by tungsten carbide, and polycrystalline diamond compact (PDC or PCD) are sometimes used in tools, such as diamond tipped tools. Polycrystalline diamond, including thermally stable polycrystalline diamond and polycrystalline diamond compact, has been considered as contraindicated for use in the machining of ferrous metals, and other metals, metal alloys, composites, hard facings, coatings, or platings that contain more than trace amounts of diamond catalyst or solvent elements including cobalt, nickel, ruthenium, rhodium, palladium, chromium, manganese, copper, titanium, or tantalum. Further, this prior contraindication of the use of polycrystalline diamond extends to so called "superalloys", including iron-based, cobalt-based and nickel-based superalloys containing more than trace amounts of diamond catalyst or solvent elements. The surface speeds typically used in machining of such materials typically ranges from about 0.2 m/s to about 5 m/s. Although these surface speeds are not particularly high, the load and attendant temperature generated, such as at a cutting tip, often exceeds the graphitization temperature of diamond (i.e., about 700° C. or about 973.15 K), which can, in the presence of diamond catalyst or solvent elements, lead to rapid wear and failure of components, such as diamond tipped tools. Without being bound by theory, the specific failure mechanism is believed to result from the chemical interaction of the carbon bearing diamond with the carbon attracting material that is being machined. An exemplary reference concerning the contraindication of polycrystalline diamond for diamond catalyst or solvent containing metal or alloy machining is U.S. Pat. No. 3,745,623, which is incorporated herein by reference in its entirety. The contraindication of polycrystalline diamond for machining diamond catalyst or solvent containing materials has long caused the avoidance of the use of polycrystalline diamond in all contacting applications with such materials.

Copper and titanium were not typically listed in the early General Electric documentation on diamond synthesis but have been added later. Relevant references include "Diamond Synthesis from Graphite in the Presence of Water and $SiO_2$"; Dobrzhinetskaya and Green, II International Geology Review Vol. 49, 2007 and "Non-metallic catalysts for diamond synthesis under high pressure and high temperature", Sun et al, Science in China August 1999.

Additional significant references that inform the background of the technology of this application are from the International Journal of Machine Tools & Manufacture 46 and 47 titled "Polishing of polycrystalline diamond by the technique of dynamic friction, part 1: Prediction of the interface temperature rise" and "Part 2, Material removal mechanism" 2005 and 2006. These references report on the dynamic friction polishing of PDC faces utilizing dry sliding contact under load with a carbon attractive steel disk. Key findings in these references indicate that polishing rate is more sensitive to sliding rate than load and that the rate of thermo-chemical reaction between the steel disk and the diamond surface reduces significantly as the surface finish of the diamond surface improves. The authors reference Iwai, Manabu & Uematsu, T & Suzuki, K & Yasunaga, N. (2001). "High efficiency polishing of PCD with rotating metal disc." Proc. of ISAAT2001. 231-238, which concludes that the thermo-chemical reaction between the steel disk and the PDC face does not occur at sliding speeds below 10.5 m/s at a pressure of 27 MPa. These references are incorporated herein by reference, as if set out in full.

It would be desirable to provide a cam follower that offers a coefficient of friction (CoF) that is comparable to that CoF of roller bearing cam followers, without the attendant weaknesses associated with the small moving parts of roller bearing cam followers.

BRIEF SUMMARY

Some aspects of the present disclosure include a cam assembly, including a cam and a cam follower, as well as to apparatus, systems, and machines including the same. The cam includes an opposing diamond reactive engagement surface. The cam follower includes a polycrystalline diamond element. The polycrystalline diamond element includes an engagement surface that is engaged with the opposing engagement surface of the cam.

Additional aspects of the present disclosure include methods of use of such cam followers, cam assemblies, and apparatus, systems, and machines including the same. The methods include providing a cam follower that includes a polycrystalline diamond element, including an engagement surface thereon. The methods include engaging the engagement surface with an opposing diamond reactive engagement surface of a cam.

BRIEF DESCRIPTION OF THE DRAWINGS

So that the manner in which the features and advantages of the systems, apparatus, and/or methods of the present disclosure may be understood in more detail, a more particular description briefly summarized above may be had by reference to the embodiments thereof which are illustrated in the appended drawings that form a part of this specification. It is to be noted, however, that the drawings illustrate only various exemplary embodiments and are therefore not to be considered limiting of the disclosed concepts as it may include other effective embodiments as well.

Systems, apparatus, and methods according to present disclosure will now be described more fully with reference to the accompanying drawings, which illustrate various exemplary embodiments. Concepts according to the present disclosure may, however, be embodied in many different forms and should not be construed as being limited by the illustrated embodiments set forth herein. Rather, these embodiments are provided so that this disclosure will be thorough as well as complete and will fully convey the scope of the various concepts to those skilled in the art and the best and preferred modes of practice.

DETAILED DESCRIPTION

Certain aspects of the present disclosure include cam followers and cam assemblies, as well as to apparatus and systems including the same, and to methods of use thereof. The cam follower may be a fixed cam follower. In some such aspects, the fixed cam follower has a lower coefficient of friction than existing fixed-type cam followers.

Figure 1:
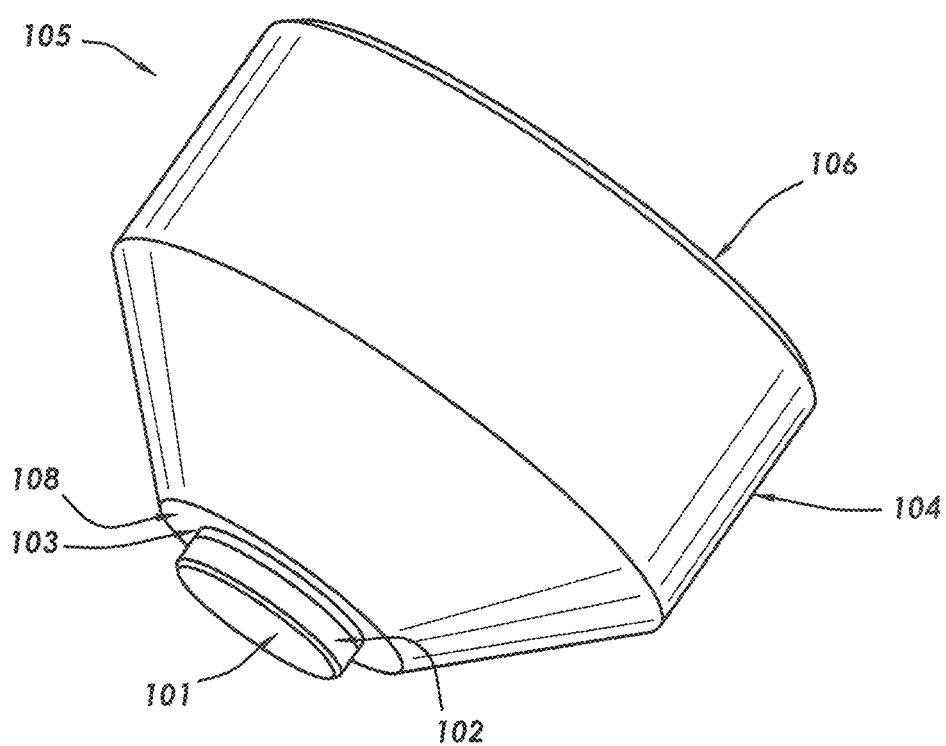
FIG. 1 is an isometric view of a cam follower in accordance with certain aspects of the present disclosure.

The cam follower disclosed herein may have a higher load capacity than existing roller-type cam followers. Thus, in some aspects, the cam follower disclosed herein is more robust and longer lasting than existing roller-type followers.
Cam Follower A cam follower in accordance with certain aspects of the present disclosure is described with reference to FIG. 1. Cam follower 105 includes cam follower body 104. Cam follower body 104 may be composed of any of variety of materials known to those skilled in the art. Cam follower body 104 has first end 106 and second end 108. One skilled in the art would understand that cam follower body 104 is not limited to the particular shape, as shown in FIG. 1, and may be any of a variety of other suitable shapes, depending upon the particular application and use.

At second end 108, cam follower body 104 is coupled to or integral with polycrystalline diamond element 102, which is composed of polycrystalline diamond. In some aspects, polycrystalline diamond element 102 is composed of thermally stable polycrystalline diamond, either supported or unsupported by tungsten carbide, or polycrystalline diamond compact.

Polycrystalline diamond element 102 is attached to cam follower body 104 via attachment 103. Polycrystalline diamond element 102 may be attached to cam follower body 104 via any of a variety of attachment methods including, but not limited to, gluing, brazing, LS bonding, press fitting, or another attachment means or method known in the art.

Polycrystalline diamond element 102 includes engagement surface 101. Engagement surface 101 may be a polycrystalline diamond layer. Engagement surface 101 may be a planar surface, as is shown in FIG. 1. In other aspects, engagement surface 101 is not a planar surface. In some aspects, engagement surface 101 is a surface of polycrystalline diamond element 102 having been lapped or polished, optionally highly lapped or highly polished. Although highly polished polycrystalline diamond elements are preferred in at least some applications, the scope of this disclosure is not limited to highly polished polycrystalline diamond elements and includes polycrystalline diamond elements that are highly lapped or polished. As used herein, a surface is defined as "highly lapped" if the surface has a surface finish of 20 μin (about 0.51 microns) or about 20 μin (about 0.51 microns), such as a surface finish ranging from about 18 (about 0.46 microns) to about 22 µin (about 0.56 microns). As used herein, a surface is defined as "polished" if the surface has a surface finish of less than about 10 µin (about 0.25 microns), or of from about 2 (about 0.05 microns) to about 10 µin (about 0.25 microns). As used herein, a surface is defined as "highly polished" if the surface has a surface finish of less than about 2 µin (about 0.05 microns), or from about 0.5 µin (about 0.01 microns) to less than about 2 µin (about 0.05 microns). In some aspects, engagement surface 101 has a surface finish ranging from 0.5 µin (about 0.01 microns) to 40 µin (about 1.02 microns), or from 2 (about 0.05 microns) µin to 30 µin (about 0.76 microns), or from 5 (about 0.13 microns) µin to 20 µin (about 0.56 microns), or from 8 µin (about 0.2 microns) to 15 µin (about 0.38 microns), or any range therebetween. Polycrystalline diamond that has been polished to a surface finish of 0.5 µin (about 0.01 microns) has a coefficient of friction that is about half of standard lapped polycrystalline diamond with a surface finish of 20-40 µin (about 0.51-1.02 microns). U.S. Pat. Nos. 5,447,208 and 5,653,300 to Lund et al., the entireties of which are incorporated herein by reference, provide disclosure relevant to polishing of polycrystalline diamond. Table 2, below, sets for a summary of coefficients of friction for various materials, including polished polycrystalline diamond, in both a dry, static state and a lubricated, static state, where the "first material" is the material that is moved relative to the "second material" to determine the CoF of the first material. As would be understood by one skilled in the art, surface finish may be measured with a profilometer or with Atomic Force Microscopy.

TABLE 2*

| First Material | Second Material | Dry Static | Lubricated Static |
|---|---|---|---|
| Hard Steel | Hard Steel | 0.78 | 0.05-0.11 |
| Tungsten Carbide | Tungsten Carbide | 0.2-0.25 | 0.12 |
| Diamond | Metal | 0.1-0.15 | 0.1 |
| Diamond | Diamond | 0.1 | 0.05-0.1 |
| Polished PDC | Polished PDC | Estimated 0.08-1 | Estimated 0.05-0.08 |
| Polished PDC | Hard Steel | Estimated 0.08-0.12 | Estimated 0.08-0.1 |

*References include Machinery's Handbook; Sexton TN, Cooley C H. Polycrystalline diamond thrust bearings for down-hole oil and gas drilling tools. Wear 2009; 267: 1041-5;

thrust bearings for down-hole oil and gas drilling tools. Wear 2009; 267:1041-5;

While polycrystalline diamond element 102 is shown as being shaped, generally, as disc positioned on second end 108 of cam follower body 104, one skilled in the art would understand that polycrystalline diamond element 102 can be any of a variety of shapes and can be arranged on cam follower body 104 in other configurations, depending on the particular application and use thereof.

Cam Assembly

Certain aspects of the present disclosure include cam assemblies, which include cam followers engaged with cams (camming components), as well as to apparatus and systems including the same, and to methods of use thereof. Cam assemblies in accordance with certain aspects of the present disclosure are described with reference to FIGS. 2A-6. In FIGS. 2A-6, like reference numerals refer to like elements. For example, an exemplary cam follower is identified with reference numeral "105" in FIG. 1 and is identified with reference numerals "205" in FIGS. 2A and 2B.

Figure 2A:
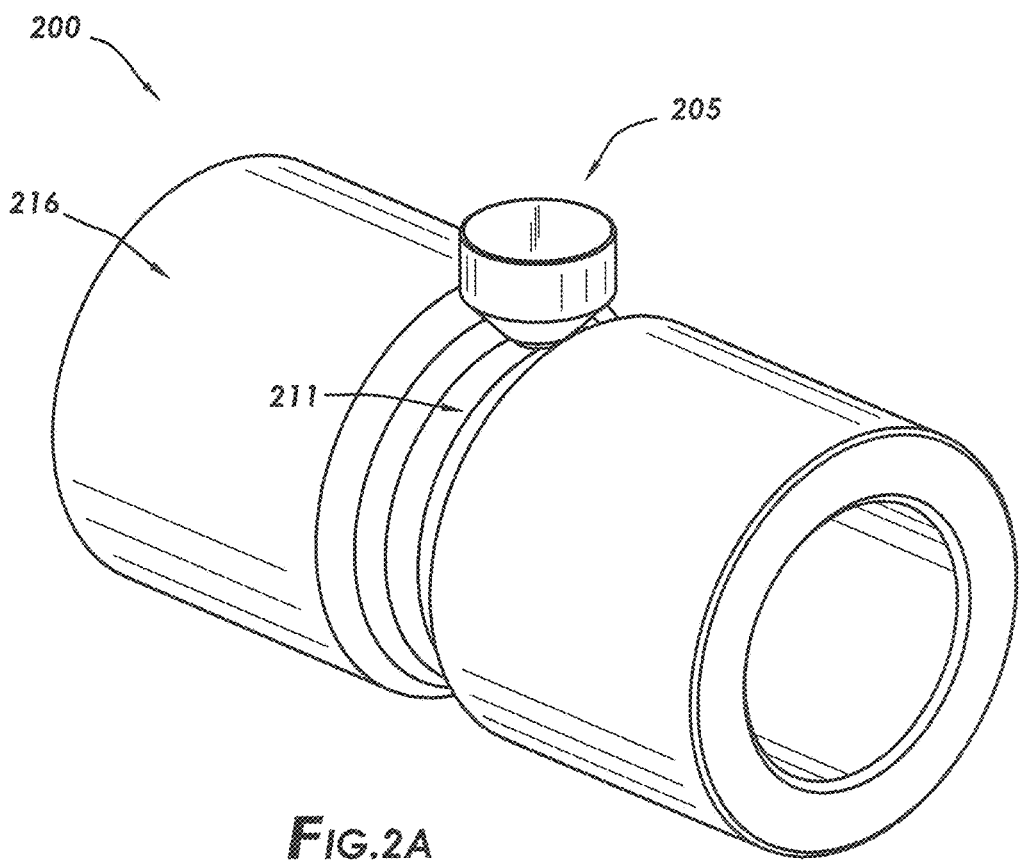
FIG. 2A is an isometric view of a cam assembly including a cam follower in sliding engagement with a camming rotor in accordance with certain aspects of the present disclosure.
Figure 2B:
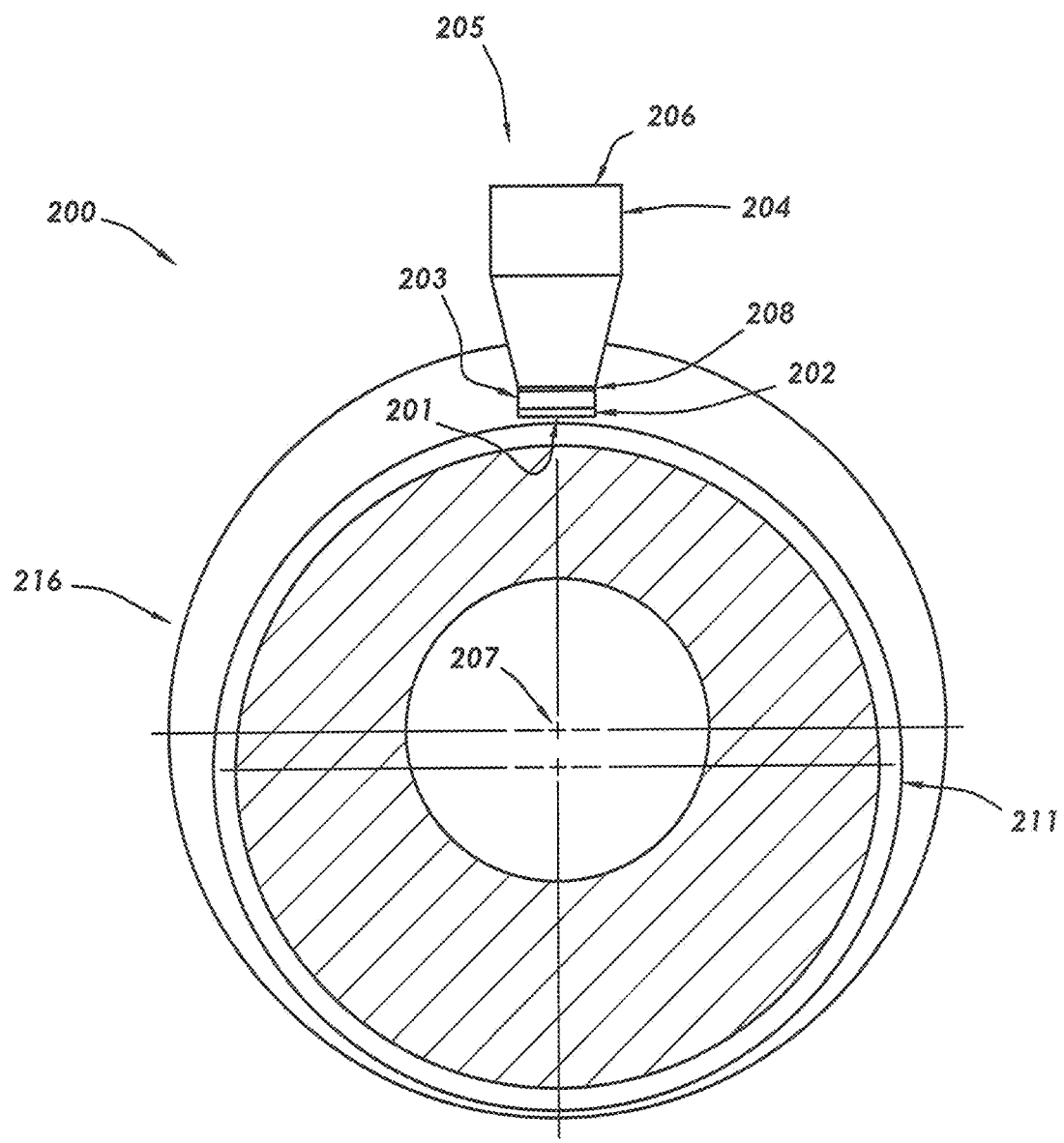
FIG. 2B is a cross-sectional view of the cam assembly of FIG. 2A.

FIG. 2A is an isometric view of cam assembly 200, and FIG. 2B is a cross-sectional view of cam assembly 200. With reference to FIGS. 2A and 2B, cam assembly 200 includes cam follower 205. As with cam follower 105, cam follower 205 includes cam follower body 204, having first end 206 and second end 208, with polycrystalline diamond element 202 coupled, via attachment 203, to cam follower body 204 at second end 208. Engagement surface 201 of cam follower 205 is in sliding engagement with opposing engagement surface 211 of cam 216, here shown as a camming rotor. While cam 216 is depicted in FIG. 2A as a camming rotor, one skilled in the art would understand that the cams disclosed herein may be any of a variety of sliding or rotating components.

In some aspects, when engaged with opposing engagement surface 211, the planar surface defined by engagement surface 201 may be at an angle relative to the surface defined by opposing engagement surface 211, such that less than an entirety of engagement surface 201 is engaged with opposing engagement surface 211. Engagement surface 201 is exemplary of a planar face polycrystalline diamond element, in accordance with one aspect of the present disclosure.

Cam rotational centerline is shown at 207 is shown in FIG. 2B. As cam 216 rotates about rotational centerline 207, opposing engagement surface 211 slidingly moves across engagement surface 201, while engaged therewith.

Opposing engagement surface 211, and optionally the entirety of cam 106, may be composed of a diamond reactive material. As used herein, a "diamond reactive material" is a material that contains more than trace amounts of diamond catalyst or diamond solvent. As used herein, a diamond reactive material that contains more than "trace amounts" of diamond catalyst or diamond solvent contains at least 2 percent by weight (wt. %) diamond catalyst or diamond solvent. In some aspects, the diamond reactive materials disclosed herein contain from 2 to 100 wt. %, or from 5 to 95 wt. %, or from 10 to 90 wt. %, or from 15 to 85 wt. %, or from 20 to 80 wt. %, or from 25 to 75 wt. %, or from 25 to 70 wt. %, or from 30 to 65 wt. %, or from 35 to 60 wt. %, or from 40 to 55 wt. %, or from 45 to 50 wt. % of diamond catalyst or diamond solvent. As used herein, a "diamond catalyst" is a chemical element, compound, or material capable of catalyzing graphitization of polycrystalline diamond, such as under load and at a temperature at or exceeding the graphitization temperature of diamond (i.e., about 700° C. or about 973.15 K). As used herein, a "diamond solvent" is a chemical element, compound, or material capable of solubilizing polycrystalline diamond, such as under load and at a temperature at or exceeding the graphitization temperature of diamond. Thus, diamond reactive materials include materials that, under load and at a temperature at or exceeding the graphitization temperature of diamond, can lead to wear, sometimes rapid wear, and failure of components formed of polycrystalline diamond, such as diamond tipped tools.

Diamond reactive materials include, but are not limited to, metals, metal alloys, and composite materials that contain more than trace amounts of diamond catalyst or solvent elements. In some aspects, the diamond reactive materials are in the form of hard facings, coatings, or platings. For example, and without limitation, the diamond reactive material may be ferrous, cobalt, nickel, ruthenium, rhodium, palladium, chromium, manganese, copper, titanium, tantalum, or alloys thereof. In some aspects, the diamond reactive material is a superalloy including, but not limited to, iron-based, cobalt-based and nickel-based superalloys. In certain aspects, the diamond reactive material is not and/or does not include (i.e., specifically excludes) so called "superhard materials." As would be understood by one skilled in the art, "superhard materials" are a category of materials defined by the hardness of the material, which may be determined in accordance with the Brinell, Rockwell, Knoop and/or Vickers scales. For example, superhard materials include materials with a hardness value exceeding 40 gigapascals (GPa) when measured by the Vickers hardness test. As used herein, superhard materials include materials that are at least as hard as tungsten carbide tiles and/or cemented tungsten carbide, such as is determined in accordance with one of these hardness scales, such as the Brinell scale. One skilled in the art would understand that a Brinell scale test may be performed, for example, in accordance with ASTM E10-14; the Vickers hardness test may be performed, for example, in accordance with ASTM E384; the Rockwell hardness test may be performed, for example, in accordance with ASTM E18; and the Knoop hardness test may be performed, for example, in accordance with ASTM E384. The "superhard materials" disclosed herein include, but are not limited to, tungsten carbide (e.g., tile or cemented), infiltrated tungsten carbide matrix, silicon carbide, silicon nitride, cubic boron nitride, and polycrystalline diamond. Thus, in some aspects, the "diamond reactive material" is partially or entirely composed of material(s) (e.g., metal, metal alloy, composite) that is softer (less hard) than superhard materials, such as less hard than tungsten carbide (e.g., tile or cemented), as determined in accordance with one of these hardness tests, such as the Brinell scale. As would be understood by one skilled in the art, hardness may be determined using the Brinell scale, such as in accordance with ASTM E10-14. In some aspects the opposing engagement surface includes or is composed of at least 2 wt. % of diamond reactive material, or from 2 to 100 wt. %, or from 5 to 95 wt. %, or from 10 to 90 wt. %, or from 15 to 85 wt. %, or from 20 to 80 wt. %, or from 25 to 75 wt. %, or from 25 to 70 wt. %, or from 30 to 65 wt. %, or from 35 to 60 wt. %, or from 40 to 55 wt. %, or from 45 to 50 wt. % of diamond reactive material.

Figure 3:
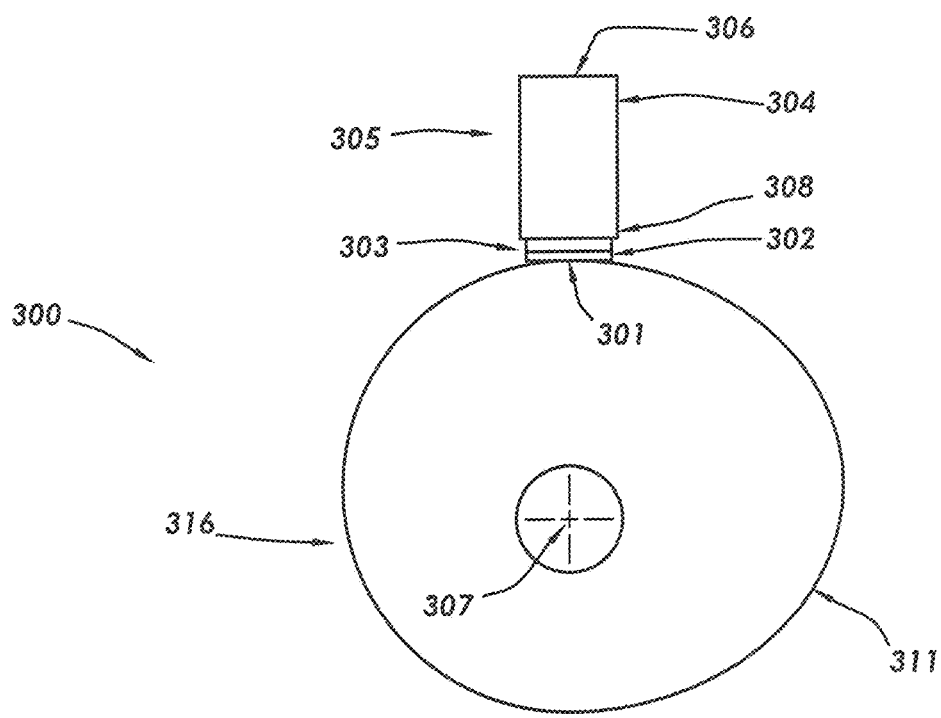
FIG. 3 is a cross-sectional view of a cam assembly including a cam follower having a planar polycrystalline diamond element in sliding engagement with a cam in accordance with certain aspects of the present disclosure.

FIG. 3 is a cross-sectional view of cam assembly 300, including an exemplary planar polycrystalline diamond cam follower 305, in accordance within one aspect of the present disclosure. Cam follower 305 is in sliding engagement with diamond reactive material of exemplary cam 316, in accordance within one aspect of the present disclosure. As cam 316 rotates about center of rotation 307, opposing engagement surface 311 slidingly moves on engagement surface 301. Cam assembly 300 includes polycrystalline diamond element 302, attachment 303, cam follower body 304, first end 306 and second end 308.

Figure 4:
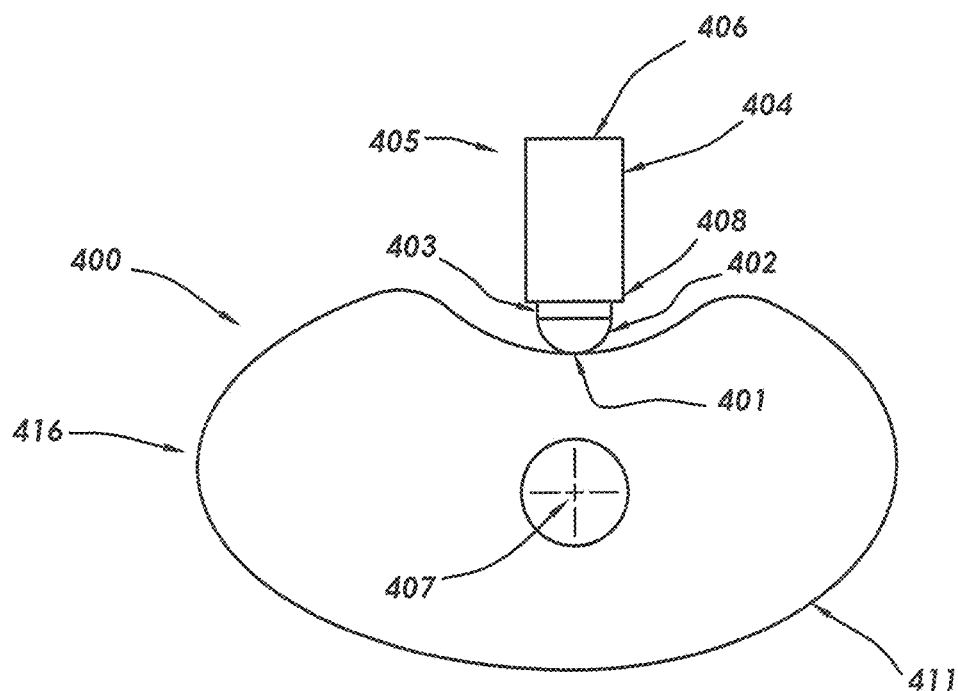
FIG. 4 is a cross-sectional view of a cam assembly including a cam follower having a dome-shaped polycrystalline diamond element in sliding engagement with a cam in accordance with certain aspects of the present disclosure.
Figure 5:
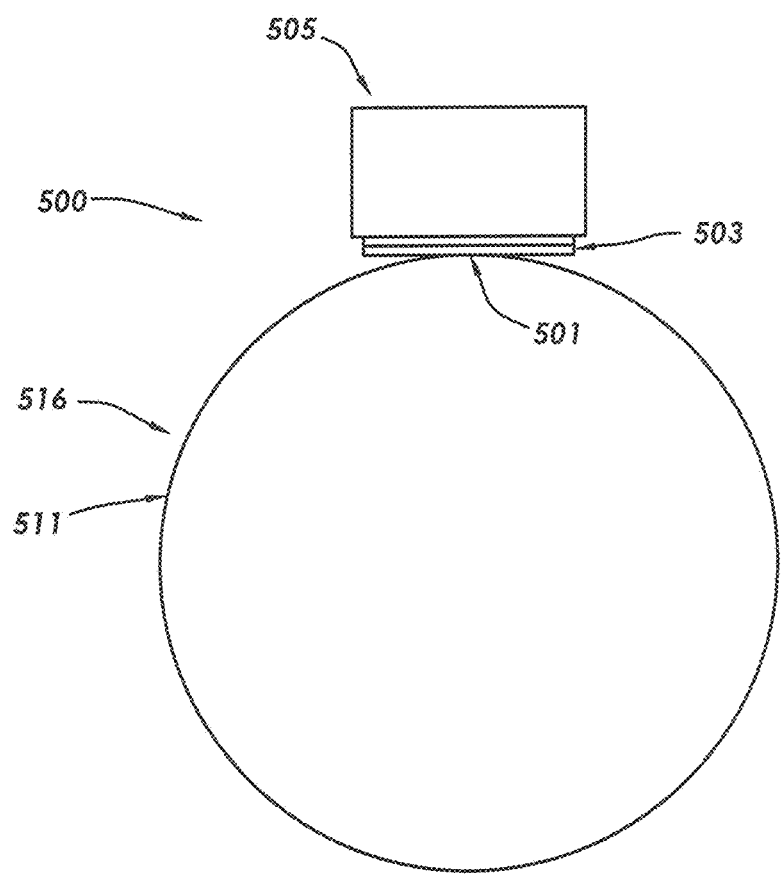
FIG. 5 depicts a cam follower engaged with a cam, without edge or point contact.

FIG. 4 is a cross-sectional view of cam assembly 400, including cam follower 405 having a dome-shaped polycrystalline diamond element 402 with engagement surface 401 in sliding engagement with opposing engagement surface 411 of cam 416, while cam 416 rotates about center of rotation 407. Cam assembly 400 includes attachment 403, cam follower body 404, first end 406 and second end 408.

Polycrystalline Diamond Element

In certain aspects of the present disclosure, the avoidance of edge or point contact between the polycrystalline diamond element and the cam is provided. For example, a planar face polycrystalline diamond element may be used for the interface (i.e., the engagement between the engagement surface and opposing engagement surface) if the cam lobe geometry is such that only facial contact will occur with the polycrystalline diamond. In other aspects different, sometimes more complex, cam lobe geometry may require a differently shaped polycrystalline diamond element, such as a dome shaped, hemisphere shaped, ovoid shaped, cylinder shaped, paraboloid shaped, radius tipped conic shaped, rounded tip chisel shaped, or other shaped polycrystalline diamond element. Regardless of the particular shape of the polycrystalline diamond element, the polycrystalline diamond element may be lapped or polished using methods known in the art. With reference to cam assembly 500 of FIG. 5, cam follower 505 is depicted, with engagement surface 501 in contact with opposing engagement surface 511 of cam 516. Edges or points 503 of the polycrystalline diamond element are not in contact with opposing engagement surface 511 (i.e., edge or point contact is avoided).

The polycrystalline diamond elements disclosed herein may have diameters as small as 3 mm (about ⅛") or as large as 75 mm (about 3"), for example, depending on the application and the configuration and diameter of the engaged cam. Typically, the polycrystalline diamond elements disclosed herein will have diameters of from 8 mm (about 5/16") to 25 mm (about 1"). One skilled in the art would understand that the polycrystalline diamond elements are not limited to these particular dimensions and may vary in size and shape depending on the particular application.

In some aspects, the polycrystalline diamond element is non-leached, leached, leached and backfilled, coated via chemical vapor deposition (CVD), or processed in various ways as known in the art.

In certain applications, the polycrystalline diamond elements disclosed herein have increased cobalt content transitions layers between the outer polycrystalline diamond surface and a supporting tungsten carbide slug, as is known in the art.

In some applications, the polycrystalline diamond elements disclosed herein may be unsupported by tungsten carbide and may be substantially "standalone", discrete polycrystalline diamond bodies that are mounted directly to the cam follower body.

In embodiments where the polycrystalline diamond element is a planar face or domed polycrystalline diamond elements, the polycrystalline diamond element may be mounted in a manner to allow the polycrystalline diamond elements to rotate about its own axis. Reference is made to U.S. Pat. No. 8,881,849, to Shen et. al., as a non-limiting example of methods to provide for a polycrystalline diamond element that spins about its own axis while in facial contact with a diamond reactive material.

Solid Lubricant Source

Figure 6:
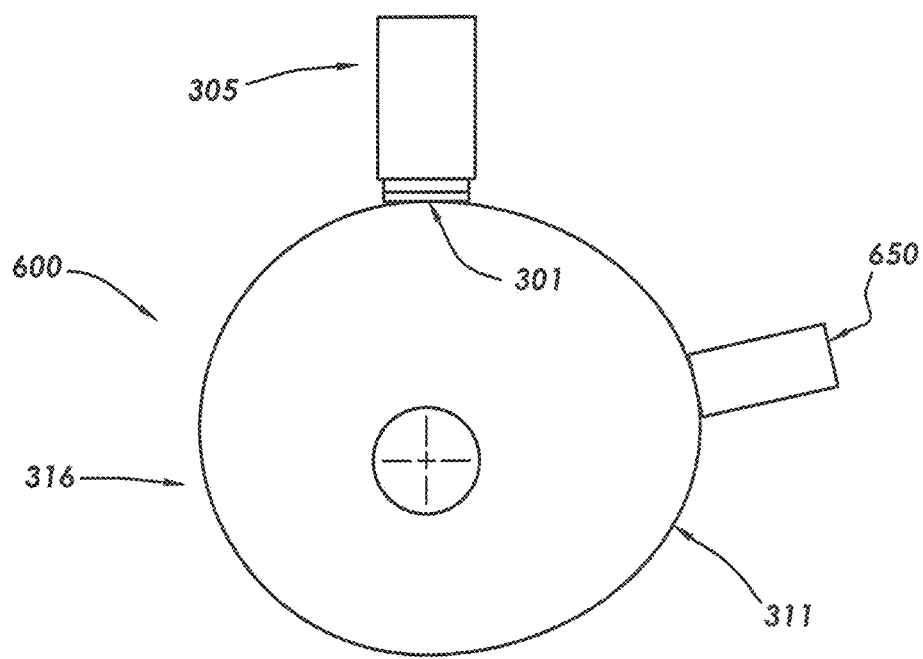
FIG. 6 depicts a cam assembly with a solid lubricant source.

In certain applications, the polycrystalline diamond element and engagement surface thereof that is slidingly interfaced with the opposing, camming, engagement surface may be augmented via a solid lubricant source. The solid lubricant source may be for example, and without limitation, a graphite or hexagonal boron nitride stick or inclusion, either energized or not energized, that is in contact with the opposing, camming, engagement surface including at least some of the diamond reactive material. FIG. 6 depicts an exemplary cam assembly 600, which is identical to that of FIG. 3, with the exception that cam assembly 600 includes solid lubricant source 650 in contact with opposing engagement surface 311.

Opposing Engagement Surface Treatments

In some aspects, the opposing engaging surface of the diamond reactive material is pre-saturated with carbon (e.g., prior to engagement with the engagement surface). Such pre-saturation reduces the ability of the diamond reactive material to attract carbon through graphitization of the surface of the polycrystalline diamond. The pre-saturation of the diamond reactive material surface may be accomplished via any method known in the art.

In some aspects, the opposing engagement surface is boronized, nitrided, or case hardened. Without being bound by theory, it is believed that such treatments of the opposing engagement surface improve performance thereof.

Applications

The cam followers and cam assemblies disclosed herein may be used in any of various applications, including high-performance applications, such as in internal combustion engines including, but not limited to, diesel engines, gasoline engines, and high performance auto and marine racing engines; drilling machines; various machining tools; and other applications. In certain aspects, the cam followers disclosed herein are high-performance cam followers capable of reliable application in harsh environments, such as in downhole environments. The cam followers disclosed herein may be high performance cam followers capable of application in non-lubricated, dusty, and/or vacuum environments including, but not limited to mining, aerospace, non-atmospheric, cyclonic, or agricultural environments.

In certain applications, the cam followers disclosed herein can operate in sliding engagement with a diamond reactive material without the occurrence of graphitization and the associated wear and failure of polycrystalline diamond components.

Exemplary Testing

In an effort to develop and assess robust cam follower interface for use in various applications, such as for use in or with the "Drilling Machine" technology, as disclosed in the '254 Application, Applicants designed and constructed an advanced test bench. The test bench employed a 200 RPM electric gearmotor driving a hard-faced ferrous rotor mandrel inside a hard-faced ferrous stator housing. The mandrel incorporated a non-hard faced offset camming cylinder midway along its length. The rotor/stator assembly was fed a circulating fluid through the use of a positive displacement pump. Candidate cam follower mechanisms were placed in sealed contact and under load with the camming cylinder of the rotor mandrel. Employing the test bench, candidate cam follower mechanisms were tested for survivability and wear under loads ranging from 500 to 3000 lbs, either in clear water or in sand laden drilling fluid.

The testing performed included tests of a curved ferrous surface in high-load facial linear area contact with planar face polycrystalline diamond under rotation. This testing produced a slightly discolored Hertzian contact area line on the face of the polycrystalline diamond about 0.250" in width along the entire ½" wide face of the polycrystalline diamond. Without being bound by theory, the width of the contact area can be a result of vibration in the system and, possibly, slight deformation of the ferrous metal under load. By calculation, the total contact area on the ½" polycrystalline diamond element face at any given point in time is about 7% of the total area of the polycrystalline diamond element face. The configuration employed in the testing demonstrated that even a small surface area on the face of a polycrystalline diamond element can handle significant load. Thus, effective polycrystalline diamond element cam followers can be designed and manufactured without the need for full face contact of the polycrystalline diamond element with the subject material cam surface.

Testing was performed on various configurations of sliding interfaces. Table 3, below, summarizes some of the testing performed, and results thereof. In Table 3, the loadings for Tests 1 through 10 are: 1200 lb (about 544 kg), 500 lb (about 227 kg), 700 lb (about 318 kg), 700 lb (about 318 kg), 900 lb (about 408 kg), 900 lb (about 408 kg), 2000 lb (about 907 kg), 2000 lb (about 907 kg), 3000 lb (about 1361 kg), and 1100 lb (about 499 kg), respectively. In the result column of Test 9, 3000 lb is equivalent to about 13,345 newtons.

TABLE 3

| | | RPM | Surface Speed | Loading | Result |
|---|---|---|---|---|---|
| | Tested Mechanism - Bearing Steel Ball in Alloy Steel Cup Against Rotating Steel Cam Surface | | | | |
| Test 1 | 1.50 Ball Socket | 200 | 1.13 m/s | 1200 lb | Abort after 3 minutes, ball is not rolling, heavy galling, on ball and cup |
| Test 2 | 1.25 Ball Socket | 200 | 1.13 m/s | 500 lb | Abort after 3 minutes, ball is not rolling, heavy galling on ball and cup |
| Test 3 | Single Polished PDC 1.50 Ball | 200 | 1.13 m/s | 700 lb | Ball is rolling, wear of steel on side wall of cup after 45 minutes |
| Test 4 | Tripod Polished PDC 1.50 Ball | 200 | 1.13 m/s | 700 lb | 20 hr. test, little wear on Ball slight Hertzian trace on PDCs |
| | Tested Mechanism - Planar PDC Rotating Steel Cam Surface | | | | |
| Test 5 | Single Polished PDC Slider | 200 | 1.13 m/s | 900 lb | Ran 20 hours, PDC direct on steel cam in water. Slight, small Hertzian trace on PDC |
| Test 6 | Single Polished PDC Slider | 200 | 1.13 m/s | 900 lb | Varied load from zero, 4 hrs, good results in water. Slight, small Hertzian trace on PDC |
| Test 7 | Single Polished PDC Slider | 200 | 1.13 m/s | 2000 lb | Varied load from zero, 20 hrs, good results in water. Slight, small Hertzian trace on PDC |
| Test 8 | Single Polished PDC Slider | 200 | 1.13 m/s | 2000 lb | Drilling Fluid & Sand test, 32+ hrs, good results. Slight, small Hertzian trace on PDC |
| Test 9 | Single Polished PDC Slider | 200 | 1.13 m/s | 3000 lb | Mud test at 3000 lbf, 10 hrs, good results. Slight, small Hertzian trace on PDC |
| Test 10 | Single Polished vs Single Unpolished | 200 | 1.13 m/s | 1100 lb | Mud test, 2 hours each, Unpolished coefficient of friction at least 50% higher by ampere measurement |

Tests 1 and 2 summarize failed tests of individual steel balls rolling in a steel cup under load. Test 3 summarizes the results of a more successful test of a steel ball supported by a single polished polycrystalline diamond element in a steel cup. Test 4 summarizes a very successful test of a single steel ball supported by an array of three polished polycrystalline diamond elements in a steel cup. Tests 5 through 9 summarize increasingly rigorous tests, each of a single polished polycrystalline diamond element in sliding contact with a rotating ferrous cam surface. Test 10 summarizes a comparative test of a single polished polycrystalline diamond element versus a single unpolished polycrystalline diamond element, each in sliding contact with a rotating ferrous cam surface. The tests demonstrated a significant increase in coefficient of friction when the unpolished polycrystalline diamond element was used. Without being bound by theory, the conditions and results presented in Table 3 are believed to be emblematic of the potential use of polycrystalline diamond on diamond reactive material and are not to be considered limiting or fully encompassing of the methods, systems, and apparatus disclosed herein.

Testing—Conclusions

The numerous and extensive tests conducted demonstrated the ability to operate the ferrous camming cylinder in sliding contact with polished polycrystalline diamond surfaces without deleterious effects or apparent chemical interaction.

The testing conducted by Applicants has established that, even at relatively high loads and high RPM speeds, a successful cam follower interface between polycrystalline diamond and a diamond reactive material cam can be practiced. A key finding of the testing was that, as long as the polycrystalline diamond element was not put into edge or point contact, which, it is believed, could lead to machining and chemical interaction, the polycrystalline diamond element can be used in sliding contact with a diamond reactive material cam at the typical loads and speeds called for in many commercial and industrial applications. The unexpected success of Applicants' testing has led to the development of new high-performance cam followers, as disclosed herein.

Applicants have found that polycrystalline diamond, in particular polished polycrystalline diamond, provides a cam follower engagement surface that has a sliding coefficient of friction that is low enough to be applied across a broad spectrum of camming mechanisms, while also avoiding the requirement for small moving parts and the need for sealed lubrication. These findings are contrary to, and are surprising and unexpected in view of, the traditional contraindication of using polycrystalline diamond in direct sliding engagement with diamond reactive materials.

Without being bound by theory, in operation, running a cam and cam follower in a liquid cooled, lubricated environment, allows for higher speeds and loads to be attained without commencing a thermo-chemical reaction. Further, a polycrystalline diamond face that has been polished, notably, provides a lower thermo-chemical response.

The PSI experienced by common cam materials typically ranges from 58,000 PSI (about 400 megapascals) to 226,000 PSI (about 1,558 megapascals). Without being bound by theory, it is believed that, for a camming PDC assembly as disclosed herein with a ½" (1.27 cm) diameter PDC cam follower, from 10,000 to 15,000 lbs (about 44,482 to about 66,723 Newtons) of force can be applied during operation of the camming PDC assembly, with a useful working life of the assembly being approximately from 1,000,000 to cycles for at least some embodiments. When operating at 3000 lbs (about 13,345 Newtons) force, equal to 150,000 PSI (1034 megapascals), it is believed that at least some embodiments of the assemblies disclosed herein can operate for a life cycle of from 1,000,000 to 100,000,000 cycles.

From the descriptions and figures provided above it can readily be understood that the cam follower technology of the present application may be employed in a broad spectrum of applications, including those in downhole environments. The technology provided herein additionally has broad application to other industrial applications.

Furthermore, while shown and described in relation to engagement between the surface of a cam follower and the surface of a cam, one skilled in the art would understand that the present disclosure is not limited to this particular application and that the concepts disclosed herein may be applied to the engagement between any diamond reactive material surface that is engaged with the surface of a diamond material.

Although the present embodiments and advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A cam assembly, the cam assembly comprising:
   a cam follower, the cam follower including a polycrystalline diamond element, wherein the polycrystalline diamond element has an engagement surface of polycrystalline diamond;
   a cam, the cam having a surface comprising steel; and
   wherein the engagement surface of polycrystalline diamond is slidingly engaged with the surface comprising steel.

2. A cam assembly, the cam assembly comprising:
   a cam follower, the cam follower including a polycrystalline diamond compact, wherein the polycrystalline diamond compact has an engagement surface of polycrystalline diamond;
   a cam, the cam having a surface comprising steel; and
   wherein the engagement surface of polycrystalline diamond is slidingly engaged with the surface of steel.

3. A cam assembly, the cam assembly comprising:
   a cam follower, the cam follower including a polycrystalline diamond element, wherein the polycrystalline diamond element has an engagement surface of polycrystalline diamond;
   a cam, the cam having a metal surface comprising a metal, wherein the metal includes at least 2 wt. % of iron, cobalt, nickel, ruthenium, rhodium, palladium, chromium, manganese, copper, titanium, tantalum, or combination thereof based on a total weight of the metal; and
   wherein the engagement surface of polycrystalline diamond is slidingly engaged with the metal surface.

4. The cam assembly of claim 3, wherein the metal includes at least 2 wt. % of iron based on the total weight of the metal.

5. The cam assembly of claim 3, wherein the metal includes at least 2 wt. % of cobalt based on the total weight of the metal.

6. The cam assembly of claim 3, wherein the metal includes at least 2 wt. % of nickel based on the total weight of the metal.

7. The cam assembly of claim 3, wherein the metal includes at least 2 wt. % of ruthenium based on the total weight of the metal.

8. The cam assembly of claim 3, wherein the metal includes at least 2 wt. % of rhodium based on the total weight of the metal.

9. The cam assembly of claim 3, wherein the metal includes at least 2 wt. % of palladium based on the total weight of the metal.

10. The cam assembly of claim 3, wherein the metal includes at least 2 wt. % of chromium based on the total weight of the metal.

11. The cam assembly of claim 3, wherein the metal includes at least 2 wt. % of manganese based on the total weight of the metal.

12. The cam assembly of claim 3, wherein the metal includes at least 2 wt. % of copper based on the total weight of the metal.

13. The cam assembly of claim 3, wherein the metal includes at least 2 wt. % of titanium based on the total weight of the metal.

14. The cam assembly of claim 3, wherein the metal includes at least 2 wt. % of tantalum based on the total weight of the metal.

15. The cam assembly of claim 3, wherein the metal is a metal alloy.

16. The cam assembly of claim 3, wherein the metal is steel.

17. The cam assembly of claim 3, wherein the metal is case hardened.

18. The cam assembly of claim 3, wherein the metal is a hard facing, a coating, or a plating on the cam.

19. The cam assembly of claim 3, wherein the metal is softer than tungsten carbide.

20. The cam assembly of claim 3, wherein the polycrystalline diamond element comprises thermally stable polycrystalline diamond.

21. The cam assembly of claim 3, wherein the polycrystalline diamond element is attached to the cam follower via gluing, brazing, LS bonding, or press fitting.

22. The cam assembly of claim 3, wherein a surface finish of the engagement surface of the polycrystalline diamond element is less than 20 μin.

\* \* \* \* \*